United States Patent [19]
Tahara et al.

[11] Patent Number: 5,883,541
[45] Date of Patent: Mar. 16, 1999

[54] HIGH FREQUENCY SWITCHING CIRCUIT

[75] Inventors: Kazuhiro Tahara; Tatsuya Miya, both of Tokyo, Japan

[73] Assignee: NEC Corporation, Tokyo, Japan

[21] Appl. No.: 811,931

[22] Filed: Mar. 5, 1997

[51] Int. Cl.[6] ............................................. H03K 17/687
[52] U.S. Cl. .......................... 327/434; 333/103; 333/104
[58] Field of Search .......................... 327/365, 374–377, 327/379, 389, 391, 404, 427, 434, 437, 308; 333/81 R, 103, 104, 262, 81 A, 32

[56] References Cited

U.S. PATENT DOCUMENTS

| | | | |
|---|---|---|---|
| 4,733,203 | 3/1988 | Ayasli | 327/427 |
| 4,837,530 | 6/1989 | Kondoh | 333/81 A |
| 5,012,123 | 4/1991 | Ayasli et al. | 307/112 |
| 5,159,297 | 10/1992 | Tateno | 327/427 |
| 5,281,928 | 1/1994 | Ravid et al. | 333/81 R |
| 5,350,957 | 9/1994 | Cooper et al. | 327/427 |
| 5,563,557 | 10/1996 | Sasaki | 333/81 R |

*Primary Examiner*—My-Trang Nu Ton
*Attorney, Agent, or Firm*—Young & Thompson

[57] ABSTRACT

A high frequency switching circuitry comprising the following elements. At least one input signal terminal is provided into which an input signal is inputted. An output signal terminal is also provided, from which an output signal is outputted. A first resistive switching circuit is connected between the input signal terminal and a first node. The first resistive switching circuit has first and second signal transmission channels having first and second resistances. The second resistance of the second channel is much higher than the first resistance of the first channel. The first resistive switching circuit switches the first and second signal transmission channels. A first switching element is connected between the first node and the output terminal. A second switching element is connected in series between the first node and a ground line. It is important that the second resistance of the second signal transmission channel of the first resistive switching circuit is almost equal to a difference of an ON-resistance of the second switching element from an impedance of a signal source of the high frequency switching circuitry.

11 Claims, 5 Drawing Sheets

HIGH FREQUENCY SWITCHING CIRCUIT

BACKGROUND OF THE INVENTION

The present invention relates to a high frequency switching circuit, and more particularly to a microwave electronic switching circuit using field effect transistors.

One of the two-input one-output high frequency switching circuits using field effect transistors will be described with reference to FIG. 1. The high frequency switching circuit has first, second and third signal terminals "A", "B" and "C". A first field effect transistor Q7 is provided in series between the first and third signal terminals "A" and "C". A second field effect transistor Q9 is provided in series between the first signal terminal "A" and a ground line. A third field effect transistor Q8 is provided in series between the second and third signal terminals "B" and "C". A fourth field effect transistor Q10 is provided in series between the second signal terminal "B" and the ground line. The high frequency switching circuit has first and second control bias terminals "VA" and "VB". A first resistor "RG1" is provided between the first control bias terminal "VA" and a gate terminal of the first field effect transistor Q7. A second resistor "RG2" is provided between the second control bias terminal "VB" and a gate terminal of the third field effect transistor Q9. A third resistor "RG3" is provided between the second control bias terminal "V3" and a gate terminal of the second field effect transistor Q8. A fourth resistor "RG4" is provided between the first control bias terminal "VA" and a gate terminal of the fourth field effect transistor Q10.

The first and second signal terminals "A" and "B" are the signal input terminals to which input signals are inputted. The third signal terminal "C" is the signal output terminal from which an output signal is outputted. If the first and third field effect transistor Q7 and Q9 are in the OFF state, then the input signals having been inputted through the first and second signal terminals "A" and "B" are cut off whereby the above switching circuit enters into OFF state. When the above switching circuit is in the OFF state, then the second and fourth field effect transistors Q8 and Q10 turn ON for attenuation of the leakage of signals If, however, the first and third field effect transistor Q7 and Q9 are in the ON state, then the input signals having been inputted through the first and second signal terminals "A" and "B" are transmitted to the third signal terminal "C" whereby the above switching circuit enters into ON state. When the above switching circuit is in the ON state, then the second and fourth field effect transistors Q8 and Q10 turn OFF. Gate control signals are applied to the first and second control bias terminals "VA" and "VB" so that the gate control signals are transmitted through the fast, second, third and fourth resistors RG1, RG2, RG3 and RG4 to the gates of the first. second, third and fourth field effect transistors Q7, Q8, Q9 and Q10.

If the first control bias terminal VA is applied with a gate control signal having a lower voltage level than a predetermined threshold voltage level and the second control bias terminal VB is applied with another gate control signal having a higher voltage level than the predetermined threshold voltage level, then the first and fourth field effect transistors Q7 and Q10 turn OFF whilst the second and third field effect transistors Q8 and Q9 turn ON. Namely, the first input signal having been inputted into the first signal terminal "A" is cut off whilst the second input signal having been inputted into the second signal terminal "B" is thus transmitted to the third signal terminal "C". In this case, the second field effect transistor Q8 is in the ON state so that the first input signal is transmitted to the ground line whereby the input signal having a high frequency is attenuated. As a result, a signal isolation or attenuation of not less than 30 dB can be ensured between the first and third signal terminals "A" and "C". This means that the first signal terminal "A" is short-circuited.

If the first control bias terminal VA is applied with a gate control signal having a higher voltage level than the predetermined threshold voltage level and the second control bias terminal VB is applied with another gate control signal having a lower voltage level than the predetermined threshold voltage level, then the first and fourth field effect transistors Q7 and Q10 turn ON whilst the second and third field effect transistors Q8 and Q9 turn OFF. Namely, the first input signal having been inputted into the first signal terminal "A" is thus transmitted to the third signal terminal "C" whilst the second input signal having been inputted into the second signal terminal "B" is cut off. In this case, the fourth field effect transistor Q10 is in the ON state so that the second input signal is transmitted to the ground line whereby the second input signal having a high frequency is attenuated. As a result, a signal isolation or attenuation of not less than 30 dB can be ensured between the second and third signal terminals "B" and "C". This means that the second signal terminal "B" is short-circuited.

If the first signal terminal "A" is short-circuited, then in order to have an input impedance accord to a characteristic impedance Z0, typically 50 Ω, 75 Ω, in the signal source side based upon the first signal terminal "A", the ON-resistance of the second field effect transistor Q8 is required to be set Z0. Actually, however, the ON-resistance of the second field effect transistor Q8 is larger by ten times or more than Z0, for which reason if the frequency of the input signal is not less than 1.5 GHz, then the signal isolation or attenuation is considerably reduced down to 20 dB.

In order to settle the above problem with such considerable reduction in the signal isolation or attenuation, multi-stage switching circuitry was proposed but this circuitry has a serious disadvantage in increased loss of the signal intensity or amplitude.

Another conventional high frequency switching circuit will subsequently be described with reference to FIG. 2, which is also disclosed in the Japanese laid-open patent publication No. 63-142716. The high frequency switching circuit has first, second and third signal terminals "A", "B" and "C" wherein the first and second signal terminals "A" and "B" are signal input terminals into which first and second input signals are inputted, whilst the third signal terminal is an output terminal from which an output signal is outputted. The high frequency switching circuit further has first and second control bias terminals "VSA" and "VSB". A first field effect transistor "Q11" is provided in series between the first and third signal terminals "A" and "C". A gate of the first field effect transistor "Q11" is grounded. A second field effect transistor "Q12" is provided in series between the second and third signal terminals "B" and "C". A gate of the first field effect transistor "Q12" is grounded. A first resistor "R2a" is provided between the first control bias terminal "VSA" and the first field effect transistor "Q11" so that the first resistor "R2a" is connected through the first field effect transistor "Q11" to the third signal terminal "C". A second resistor "R2b" is provided between the second control bias terminal "VSB" and the second field effect transistor "Q12" so that the second resistor "R2b" is connected through the second field effect transistor "Q12"to the third signal terminal "C". However, the above switching circuitry is never the impedance matching termination switching circuit.

The above first high frequency switching circuit may be configured to be the impedance matching termination switching circuit. In this case, however, the isolation property of the circuit is remarkably deteriorated. In order to ensure the required isolation property of the circuit, the multi-stage circuit configuration is needed, resulting in an increased passing loss thereof. Further, if the ON resistances of the second and fourth field effect transistors are 50 Ω, the isolation property at a higher frequency of not less than 50 GHz is deteriorated.

The above second high frequency switching circuit could never be configured to be the impedance matching termination switching circuit and also the switching circuit shows a deterioration in the isolation or attenuation at the higher frequency of not less than 50 GHz.

In recent years, micro-wave communications have been made frequently. It is likely that many devices having a plurality of local oscillators have been produced. Such local oscillator is sensitive to an external impedance, for which reason high frequency switching circuit for switching those devices is required to be impedance matching termination switching circuit having a high isolation property.

SUMMARY OF THE INVENTION

Accordingly, it is an object of the present invention to provide a novel high frequency switching circuit free from any problems as described above.

It is a Other object of the present invention to provide a novel high frequency impedance matching termination switching circuit having a high isolation property.

The above and other objects, features and advantages of the present invention will be apparent from the following descriptions.

The present invention provides a high frequency switching circuitry comprising the following elements. At least one input signal terminal is provided, into which an input signal is inputted. An output signal terminal is also provided, from which an output signal is outputted. A first resistive switching circuit is connected between the input signal terminal and a first node. The first resistive switching circuit has first and second signal transmission channels having first and second resistances. The second resistance of the second channel is much higher than the first resistance of the first channel. The first resistive switching circuit switches the first and second signal transmission channels. A first switching element is connected between the first node and the output terminal. A second switching element is connected in series between the first node and a ground line. It is important that the second resistance of the second signal transmission channel of the first resistive switching circuit is almost equal to a difference of an ON-resistance of the second switching element from an impedance of a signal source of the high frequency switching circuitry.

The present invention also provides a high frequency switching circuitry comprising the following elements. At least one input signal terminal is provided into which an input signal is inputted. An output signal terminal is also provided, from which an output signal is outputted. A first resistive switching circuit is connected between the input signal terminal and a first node. The first resistive switching circuit has first and second signal transmission channels having first and second resistances. The second resistance of the second channel is much higher than the first resistance of the first channel. The first resistive switching circuit switches the first and second signal transmission channels. A first switching element is connected between the first node and the output terminal. A second switching element is connected in series between the first node and a ground line. It is important that the second resistance of the second signal transmission channel of the first resistive switching circuit is almost equal to a difference of an ON-resistance of the second switching element from an impedance of a signal source of the high frequency switching circuitry.

BRIEF DESCRIPTIONS OF THE DRAWINGS

Preferred embodiments of the present invention will be described with reference to the accompanying drawings.

DISCLOSURE OF THE INVENTION

Figure 1:
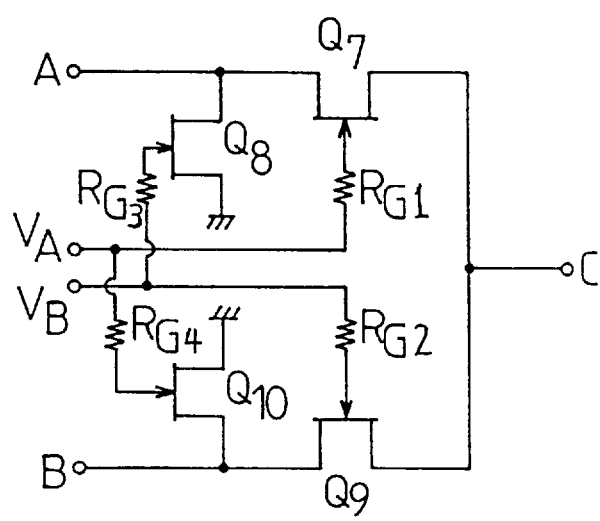
FIG. 1 is a circuit diagram illustrative of the first conventional high frequency impedance matching termination switching circuit having a low isolation property.
Figure 2:
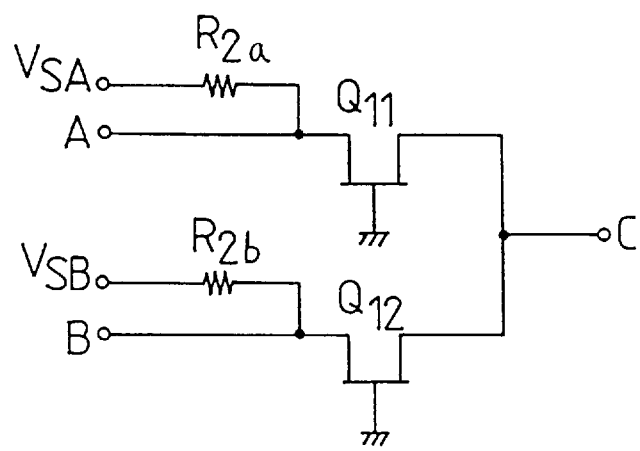
FIG. 2 is a circuit diagram illustrative of the second conventional high frequency switching circuit having a high isolation property but which is never configured to be the impedance matching termination switching circuit.

The present invention provides a high frequency switching circuitry comprising the following elements. At least one input signal terminal is provided, into which an input signal is inputted. An output signal terminal is also provided, from which an output signal is outputted. First and second field effect transistors are connected in series between the input signal terminal and the output signal terminal. The first field effect transistor is coupled to the input signal terminal. The second field effect transistor is coupled to the output signal terminal. The first and second field effect transistors is connected to each other via a first node. A third field effect transistor is connected in series between the node and a ground line. A first gate control signal line is provided, on which a first gate control signal is applied. The first gate control signal line is connected to both gates of the first and second field effect transistors for transmitting the first gate control signal to the gates of the first and second field effect transistors. A second gate control signal line is further provided, on which a second gate control signal is applied. The second gate control signal line is connected to a gate of the third field effect transistor. A first resistor is connected in parallel to the first field effect transistor between the input signal terminal and the first node. It is important that the first resistor has a first resistance which is almost equal to a difference of an ON-resistance of the third field effect transistor from an impedance of a signal source of the high frequency switching circuitry.

It is possible to further provide the following elements. A secondary input signal terminal is provided, into which a second input signal is inputted. Fourth and fifth field effect transistors are connected in series between the secondary input signal terminal and the output signal terminal. The fourth field effect transistor is coupled to the secondary input signal terminal. The fifth field effect transistor is coupled to the output signal terminal. The fourth and fifth field effect transistors are connected to each other via a second node. A sixth field effect transistor is connected in series between the second node and a ground line. A second resistor is connected in parallel to the fourth field effect transistor between the secondary input signal terminal and the second node. It is important that the second resistor has a second resistance which is almost equal to a difference of an ON-resistance of the sixth field effect transistor from an impedance of a signal source of the high frequency switching circuitry.

It is also possible to further provide the following elements. A third resistor is connected in parallel to the second field effect transistor between the output signal terminal and the first node. The third resistor has a third resistance which is almost equal to the first resistance of the first resistor.

The present invention also provides a high frequency switching circuitry comprising the following elements. At least one input signal terminal is provided into which an input signal is inputted. An output signal terminal is also provided, from which an output signal is outputted. A first resistive switching circuit is connected between the input signal terminal and a first node. The first resistive switching circuit has first and second signal transmission channels having first and second resistances. The second resistance of the second channel is much higher than the first resistance of the first channel. The first resistive switching circuit switches the first and second signal transmission channels. A first switching element is connected between the first node and the output terminal. A second switching element is connected in series between the first node and a ground line. It is important that the second resistance of the second signal transmission channel of the first resistive switching circuit is almost equal to a difference of an ON-resistance of the second switching element from an impedance of a signal source of the high frequency switching circuitry.

It is possible that the first resistive switching circuit comprises a third switching element connected between the input signal terminal and the first node, and a first resistor connected in parallel to the third switching element between the input signal terminal and the first node.

It is also possible that the first, second and third switching elements comprise first, second and third field effect transistors, and also possible to further provide first and second gate control signal lines on which first and second gate control signals are transmitted. The first gate control signal line is connected to gates of the first and third field effect transistors. The second gate control signal line is connected to a gate of the second field effect transistor.

It is also possible to further provide the following elements. A secondary input signal terminal is provided into which a second input signal is inputted. A second resistive switching circuit is connected between the secondary input signal terminal and a second node. The second resistive switching circuit has third and fourth signal transmission channels having third and fourth resistances. The fourth resistance of the fourth channel is much higher than the third resistance of the third channel. The second resistive switching circuit switches the third and fourth signal transmission channels. A fourth switching element is connected in series between the second node and the output terminal. A fifth switching element is connected in series between the second node and a ground line. It is important that the fourth resistance of the fourth signal transmission channel of the second resistive switching circuit is almost equal to a difference of an ON-resistance of the fourth switching element from an impedance of a signal source of the high frequency switching circuitry.

It is possible that the second resistive switching circuit comprises a sixth switching element connected between the input signal terminal and the second node, and a second resistor connected in parallel to the sixth switching element between the input signal terminal and the second node.

In the above case, it is preferable that the fourth, fifth and sixth switching elements comprise fourth, fifth and sixth field effect transistors, and also preferable to further provide first and second gate control signal lines on which first and second gate control signals are transmitted. The second gate control signal line is connected to gates of the fourth and sixth field effect transistors The first gate control signal line is connected to a gate of the fifth field effect transistor.

PREFERRED EMBODIMENTS

Figure 3:
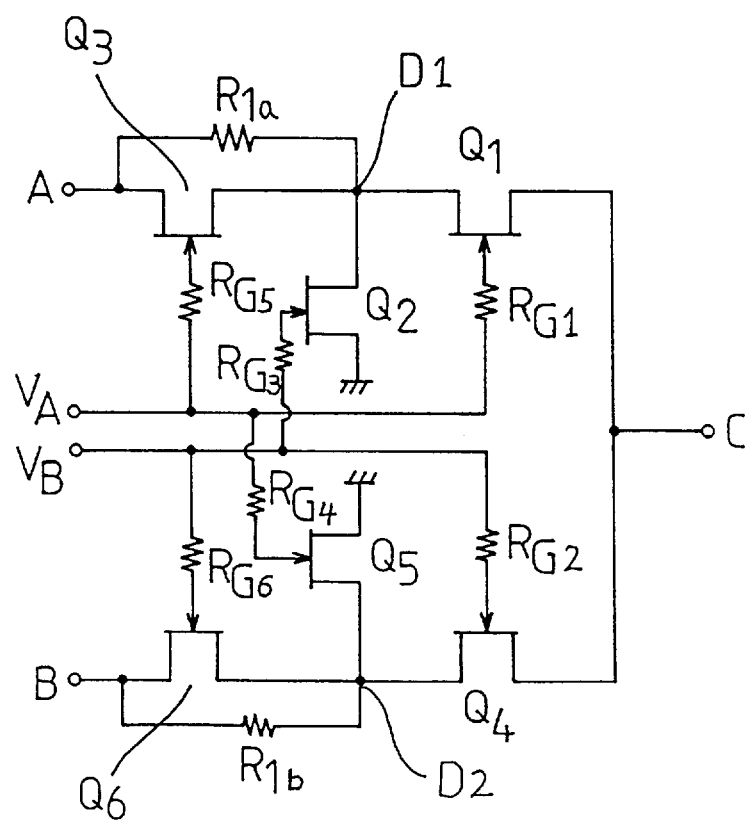
FIG. 3 is a circuit diagram illustrative of a novel high frequency impedance matching termination switching circuit having a high isolation property in a first embodiment according to the present invention.

A first embodiment according to the present invention will be described with reference to FIGS. 3 and 5, wherein a novel high frequency impedance matching termination switching circuit having a high isolation property is provided.

The high frequency switching circuit has first, second and third signal terminals "A", "B" and "C". The first and second signal terminals "A" and "B" are the signal input terminals to which input signals are inputted. The third signal terminal "C" is the signal output terminal from which an output signal is outputted A first field effect transistor Q1 is provided in series between the third output signal terminal "C" and a first node "D1". A second field effect transistor Q2 is provided in series between the first node "D1"and a ground line. A third field effect transistor Q3 is provided in series between the first input signal terminal "A" and the first node "D1". The first and third field effect transistors Q1 and Q3 are connected in series between the first input signal terminal "A" and the third output signal terminal "C". The first and third field effect transistors Q1 and Q3 are coupled via the first node "D1" to each other. The second field effect transistor Q2 is connected in series between the ground line and the first node "D1" as an intermediate point between the first and third field effect transistors Q1 and Q3. Namely, the first and second field effect transistors Q1 and Q2 are connected in series between the ground line and the third output signal terminal "C". The second and third field effect transistors Q1 and Q3 are connected in series between the ground line and the first input signal terminal "A". A fourth field effect transistor Q4 is provided in series between the third output signal terminal "C" and a second node "D2". A fifth field effect transistor Q8 is provided in series between the second node "D2" and the ground line. A sixth field effect transistor Q6 is provided in series between the second input signal terminal "B" and the second node "D2". The fourth and sixth field effect transistors Q4 and Q6 are connected in series between the second input signal terminal "B" and the third output signal terminal "C". The fourth and sixth field effect transistors Q4 and 06 are coupled via the second node "D2" to each other. The fifth field effect transistor Q5 is connected in series between the ground line and the second node "D2" as an intermediate point between the fourth and sixth field effect transistors Q4 and Q6. Namely, the fourth and fifth field effect transistors Q4 and Q5 are connected in series between the ground line and the third output signal terminal "C". The fifth and sixth field effect transistors Q5 and Q6 are connected in series between the ground line and the second input signal terminal "B".

The high frequency switching circuit also has first and second control bias terminals "VA" and "VB" into which first and second gate control signals are applied. A first resistor "RG1" is provided between the first control bias terminal "VA" and a gate terminal of the first field effect transistor Q1. A second resistor "RG2" is provided between the second control bias terminal "VB" and a gate terminal of the fourth field effect transistor Q4. A third resistor "RG3" is provided between the second control bias terminal "VB" and a gate terminal of the second field effect transistor Q2. A fourth resistor "RG4" is provided between the first control bias terminal "VA" and a gate terminal of the fifth field effect transistor Q5. A fifth resistor "RG5" is provided between the first control bias terminal "VA" and a gate temiinal of the third field effect transistor Q3. A sixth resistor "RG6" is provided between the second control bias terminal "VB" and a gate terminal of the sixth field effect transistor Q6. Further, a seventh resistor "R1$a$" is provided between the first input signal terminal "A" and the first node "D1" in parallel to the third field effect transistor Q3. An eighth resistor "R1$b$" is provided between the second input signal terminal "B" and the second node "D2" in parallel to the sixth field effect transistor Q6. The seventh and eighth resistors "R1$a$" and "R1$b$" have a resistance which is almost equal to an impedance of a signal source for generating a signal to be inputted into the first or second signal terminal "A" or "B".

Operations of the above novel high frequency and high isolation impedance matching termination switching circuit will be described in a first mode wherein the first input signal applied to the first signal terminal "A" is cut off, whilst the second input signal applied to the second signal terminal "B" is transmitted to the third output signal terminal "C".

The first control bias terminal "VA" is applied with a first gate control signal of a lower voltage level than a threshold voltage Vth whilst the second control bias terminal "VB" is applied with a second gate control signal of a higher voltage level than the threshold voltage Vth. The first gate control signal having been applied to the first control bias terminal "VA" is then transmitted through the first resistor "RG1" to the gate electrode of the first field effect transistor Q1 whereby the first field effect transistor Q1 turns OFF. The first gate control signal is also transmitted through the fourth resistor "RG4" to the gate electrode of the fifth field effect transistor Q5 whereby the fifth field effect transistor Q8 turns OFF. The first gate control signal is also transmitted through the fifth resistor "RGS" to the gate electrode of the third field effect transistor Q3 whereby the third field effect transistor Q3 turns OFF. The second gate control signal having been applied to the second control bias terminal "VB" is then transmitted through the second resistor "RG2" to the gate electrode of the fourth field effect transistor Q4 whereby the fourth field effect transistor Q4 turns ON. The second gate control sisal is also transmitted through the third resistor "RG3" to the gate electrode of the second field effect transistor Q2 whereby the second field effect transistor Q2 turns ON. The second gate control signal is also transmitted through the sixth resistor "RG6" to the gate electrode of the sixth field effect transistor Q6 whereby the sixth field effect transistor Q6 turns ON.

In the above state, the first and third field effect transistors Q1 and Q3 are in the OFF state whilst the second field effect transistor Q2 is ON state. If a first input signal having an amplitude of V1 is applied to the first input signal terminal "A", then the first input signal is transmitted through the seventh resistor "R1$a$", the first node "D1" and the second field effect transistor Q2 to the ground line. A signal component having an amplitude V2 appears on the first node "D1", wherein the amplitude V2 is defined by a voltage-dividing ratio of the resistance of the seventh resistor "R1$a$" to an ON resistance of the second field effect transistor Q2. Assuming that the signal source impedance is 50 Ω and the ON resistance "Ron" of the second field effect transistor Q2 is 5 Ω. the resistance "R1" of the seventh resistor "R1$a$" is set 45 Ωso that the input impedance of the first input signal terminal "A" is given by (R1)+Ron=50 Ω whereby the required impedance matching is obtained. In this case, the amplitude V2 of the signal component having appeared on the first node D1 is one tenth of the amplitude V1 of the first input signal applied to the first signal input terminal "A". The above novel high frequency impedance matching termination switching circuit illustrated in FIG. 3 shows an improved isolation or attenuation which is higher by 10 dB than that of the conventional high frequency impedance matching termination switching circuit illustrated in FIG. 1.

On the other hand, the fifth field affect transistor Q5 is in the OFF state whilst the fourth and sixth field effect transistors Q4 and Q6 are in the ON state. Thus, the second input signal applied to the second input signal terminal "B" is then transmitted through the sixth and fourth field effect transistors Q6 and Q4 to the third output signal terminal "C".

Subsequently, operations of the above novel high frequency and high isolation impedance matching termination switching circuit will be described in a second mode wherein the first input signal applied to the first signal terminal "A" is transmitted to the third output signal terminal "C", whilst the second input signal applied to the second signal terminal "B" is cut off.

The first control bias terminal "VA" is applied with a first gate control signal of a higher voltage level than the threshold voltage Vth whilst the second control bias terminal "VB" is applied with a second gate control signal of a lower voltage level than the threshold voltage Vth. The first gate control signal having been applied to the first control bias terminal "VAN" is then transmitted through the first resistor "RG1" to the gate electrode of the first field effect transistor Q1 whereby the first field effect transistor Q1 turns ON. The first gate control signal is also transmitted through the fourth resistor "RG4" to the gate electrode of the fith field effect transistor Q5 whereby the fifth field effect transistor Q8 turns ON. The first gate control signal is also transmitted through the fifth resistor "RG5" to the gate electrode of the third field effect transistor Q3 whereby the third field effect transistor Q3 turns ON. The second gate control signal having been applied to the second control bias terminal "VB" is then transmitted through the second resistor "RG2" to the gate electrode of the fourth field effect transistor Q4 whereby the fourth field effect transistor Q4 turns OFF. The second gate control signal is also transmitted through the third resistor "RG3" to the gate electrode of the second field effect trsistor Q2 whereby the second field effect transistor Q2 turns OFF. The second gate control signal is also transmitted through the sixth resistor "RG6" to the gate electrode of the sixth field effect transistor Q6 whereby the sixth field effect transistor Q6 turns OFF.

In the above state, the fourth and sixth field effect transistors Q4 and Q6 are in the OFF state whilst the fifth field effect transistor Q8 is ON state. If a second input signal having an amplitude of V3 is applied to the second input signal terminal "B", then the second input signal is transmitted through the eighth resistor "R1$b$", the second node "D2" and the fifth field effect transistor Q8 to the ground line. A signal component having an amplitude V4 appears on the second node "D2", wherein the amplitude V4 is defined by a voltage-dividing ratio of the resistance of the eighth resistor "R1b" to an ON resistance of the fifth field effect transistor Q5. Assuming that the signal source impedance is 50 Ω and the ON resistance "Ron" of the fifth field effect transistor Q5 is 5 Ω, the resistance "R2" of the eighth resistor "R1b" is set 45 Ω so that the input impedance of the second input signal terminal "B" is given by (R2)+Ron=50 Ω whereby the required impedance matching is obtained. In this case, the amplitude V4 of the signal component having appeared on the second node D2 is one tenth of the amplitude V3 of the second input signal applied to the second signal input terminal "B". The above novel high frequency impedance matching termination switching circuit illustrated in FIG. 3 shows an improved isolation or attenuation which is higher by 10 dB than that of the conventional high frequency impedance matching termination switching circuit illustrated in FIG. 1.

On the other hand, the second field effect transistor Q2 is in the OFF state whilst the first and third field effect transistors Q1 and Q3 are in the ON state. Thus, the first input signal applied to the second input signal terminal "A" is then transmitted through the third and first field effect transistors Q3 and Q1 to the third output signal terminal "C".

Figure 5:
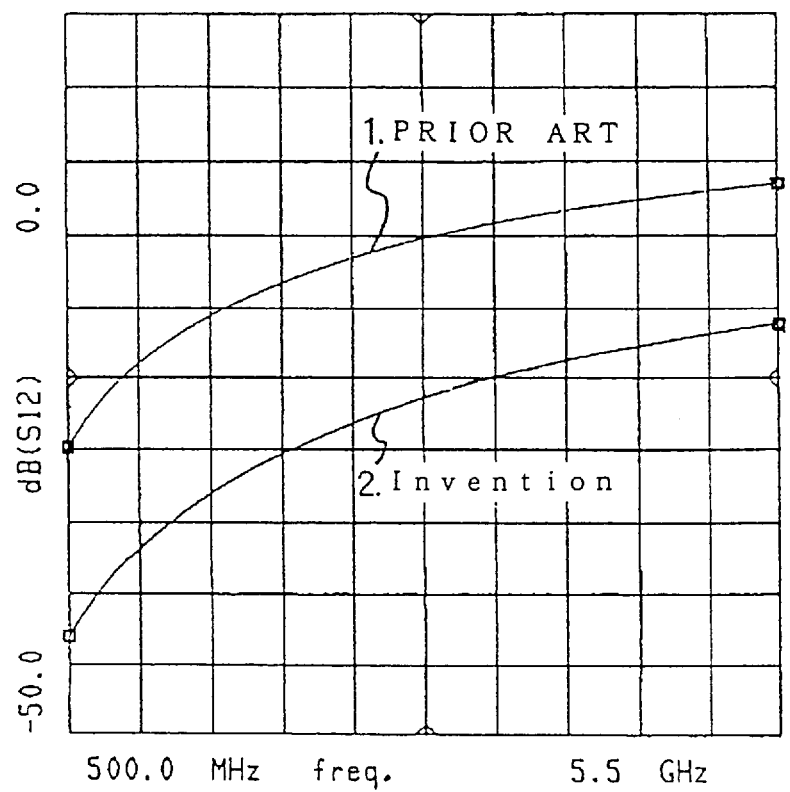
FIG. 5 is a diagram illustrative of variations in isolation or attenuation over frequency of the conventional impedance matching termination switching circuit having a low isolation property and a novel impedance matching termination switching circuit having a high isolation property in accordance with the present invention.

FIG. 5 is illustrative of variations in isolation or attenuation over frequency of the conventional high frequency impedance matching termination switching circuit having a low isolation property and the above novel high frequency impedance matching termination switching circuit having the high isolation property in accordance with the present invention. The isolation or attenuation of the above novel high frequency impedance matching termination switching circuit remains higher by 10–12 dB than that of the conventional high frequency impedance matching termination switching circuit.

Figure 4:
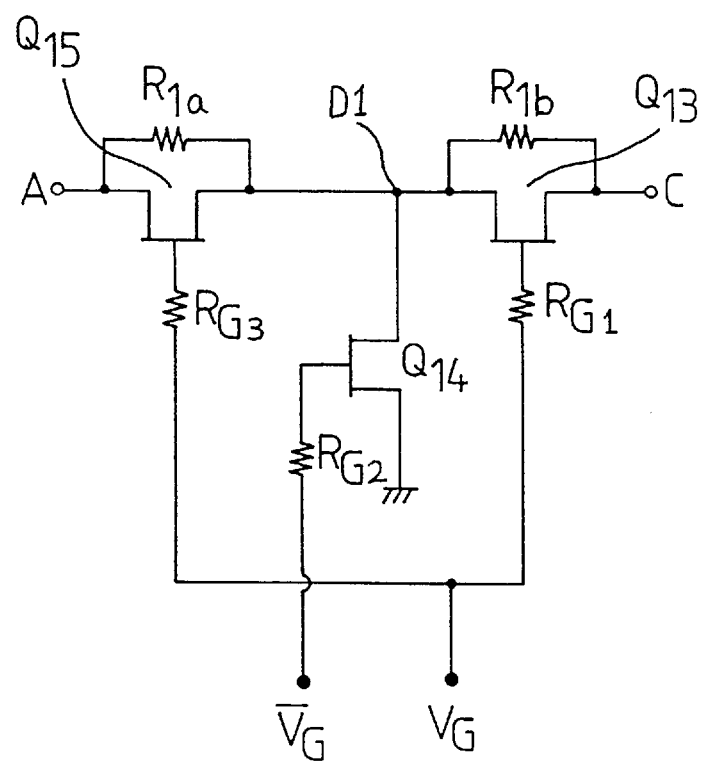
FIG. 4 is a circuit diagram illustrative of a novel high frequency impedance matching termination switching circuit hating a high isolation property in a second embodiment according to the present invention.

A second embodiment according to the present invention will be described with reference to FIG. 4, wherein a novel high frequency impedance matching termination switching circuit having a high isolation property is provided.

The high frequency switching circuit has first and second signal terminals "A" and "C". The first signal terminal "A" is the signal input terminal to which an input signal is inputted. The second signal terminal "C" is the signal output terminal from which an output signal is outputted. A first field effect transistor Q13 is provided in series between the second output signal terminal "C" and a first node "D1". A second field effect transistor Q14 is provided in series between the first node "D1" and a ground line. A third field effect transistor Q15 is provided in series between the first input signal terminal "A" and the first node "D1". The first and third field effect transistors Q13 and 015 are connected in series between the first input signal terminal "A" and the second output signal terminal "C". The first and third field effect transistors Q13 and Q15 are coupled via the first node "D1" to each other. The second field effect transistor Q14 is connected in series between the ground line and the first node "D1" as an intermediate point between the first and third field effect transistors Q13 and Q15. Namely, the first and second field effect transistors Q13 and Q14 are connected in series between the ground line and the third output signal terminal "C". The second and third field effect transistors Q14 and Q15 are connected in series between the ground line and the first input signal terminal "A".

The high frequency switching circuit also has first and second control bias terminals "VG" and "$\overline{VG}$" into which first and second gate control signals are applied. A first resistor "RG1" is provided between the first control bias terminal "$\overline{VG}$" and a gate terminal of the first field effect transistor Q13. A second resistor "RG2" is provided between the second control bias terminal "AVG" and a gate terminal of the second field effect transistor Q14. A third resistor "RG3" is provided between the first control bias terminal "VG" and a gate terminal of the third field effect transistor Q15. A fourth resistor "R1a" is provided between the first input signal terminal "A" and the first node "D1" in parallel to the third field effect transistor Q15. A fifth resistor "R1b" is provided between the first node "D1" and the second output signal terminal "C" in parallel to the first field effect transistor Q13. The fourth and fifth resistors "R1a" and "R1b" have a resistance which is almost equal to an impedance of a signal source for generating a signal to be inputted into the first signal terminal "A".

Operations of the above novel high frequency and high isolation impedance matching termination switching circuit will be described in a first mode wherein the input signal applied to the first signal terminal "A" is transmitted to the third output signal terminal "C".

The first control bias terminal "VG" is applied with a first gate control signal of a higher voltage level than a threshold voltage Vth whilst the second control bias terminal "$\overline{VG}$" is applied with a second gate control signal of a lower voltage level than the threshold voltage Vth. The first gate control signal having been applied to the first control bias terminal "VG" is then transmitted through the first resistor "RG1" to the gate electrode of the first field effect transistor Q13 whereby the first field effect transistor Q13 turns ON. The first gate control signal is also transmitted through the third resistor "RG3" to the gate electrode of the third field effect transistor Q15 whereby the third field effect transistor Q15 turns ON. The second gate control signal having been applied to the second control bias terminal "$\overline{VG}$" is then transmitted through the second resistor "RG2" to the gate electrode of the second field effect transistor Q14 whereby the second field effect transistor Q14 turns OFF.

In the above state, the first and third field effect transistors Q13 and Q15 are in the ON state whilst the second field effect transistor Q14 is the OFF state. The input signal having been applied to the first input signal terminal is then transmitted to the second output terminal "C".

Subsequently, operations of the above novel high frequency and high isolation impedance matching termination switching circuit will be described in a first mode wherein the input signal applied to the first signal terminal "A" is cut off and no signal appears at the third output signal terminal "C".

The first control bias terminal "VG" is applied with a first gate control signal of a lower voltage level than the threshold voltage Vth whilst the second control bias terminal "$\overline{VG}$" is applied with a second gate control signal of a higher voltage level than the threshold voltage Vth. The first gate control signal having been applied to the first control bias terminal "VG" is then transmitted through the first resistor "RG1" to the gate electrode of the first field effect transistor Q13 whereby the first field effect transistor Q13 turns OFF. The first gate control signal is also transmitted through the third resistor "RG3" to the gate electrode of the third field effect transistor Q15 whereby the third field effect transistor Q15 turns OFF. The second gate control signal having been applied to the second control bias terminal "$\overline{VG}$" is then transmitted through the second resistor "RG2" to the gate electrode of the second field effect transistor Q14 whereby the second field effect transistor Q14 turns ON. As a result, the input signal is then transmitted through the fourth resistor R1a, the first node "D1" and the second field effect transistors Q14 to the ground line. If the input signal has an amplitude of V1, then a signal component having an amplitude V2 appears on the first node "D1", wherein the amplitude V2 is defined by a voltage-dividing ratio of the resistance of the fourth resistor "R1a" to an ON resistance of the second field effect transistor Q14. Assuming that the signal source impedance is 50 Ω and the ON resistance "Ron" of the second field effect transistor Q14 is 5 Ω, the resistance "R1" of the fourth resistor "R1a" is set 45 Ω so that the input impedance of the first input signal terminal "A" is given by (R1)+Ron=50 Ω whereby the required impedance matching is obtained. In this case, the amplitude V2 of the signal component having appeared on the first node "D1" is one tenth of the amplitude V1 of the first input signal applied to the first signal input terminal "A". The above novel high frequency impedance matching termination switching circuit illustrated in FIG. 4 shows an improved isolation or attenuation which is higher by 10 dB than that of the conventional high frequency impedance matching termination switching circuit illustrated in FIG. 1.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A high frequency switching circuitry comprising:

at least one input signal terminal into which an input signal is inputted;

an output signal terminal from which an output signal is outputted;

first and second field effect transistors connected in series between said input signal terminal and said output signal terminal, said first field effect transistor being coupled to said input signal terminal, said second field effect transistor being coupled to said output signal terminal, said first and second field effect transistors being directly connected to each other via a first node;

a third field effect transistor directly connected at said first node so that said third field effect transistor is connected in series between said first node and a ground line;

a first gate control signal line on which a first gate control signal is applied, said first gate control signal line being connected to both gates of said first and second field effect transistors for transmitting said first gate control signal to said gates of said first and second field effect transistors;

a second gate control signal line on which a second gate control signal is applied, said second gate control signal line being connected to a gate of said third field effect transistor; and a first resistor connected in parallel to said first field effect transistor between said input signal terminal and said first node, wherein said first resistor has a first resistance which is approximately equal to a difference of an ON-resistance of said third field effect transistor from an output impedance of a first signal source of said high frequency switching circuitry.

2. The high frequency switching circuitry of claim 1, further comprising:

a secondary input signal terminal into which a second input signal is inputted;

fourth and fifth field effect transistors connected in series between said secondary input signal terminal and said output signal terminal, said fourth field effect transistor being coupled to said secondary input signal terminal, said fifth field effect transistor being coupled to said output signal terminal, said fourth and fifth field effect transistors being directly connected to each other via a second node;

a sixth field effect transistor connected in series between said second node and a ground line; and a second resistor connected in parallel to said fourth field effect transistor between said secondary input signal terminal and said second node, wherein said second resistor has a second resistance which is approximately equal to a difference of an ON-resistance of said sixth field effect transistor from an output impedance of a second signal source of said high frequency switching circuitry.

3. The high frequency switching circuitry of claim 2, wherein said first gate control signal is connected to a gate of said sixth field effect transistor, said second gate control signal being connected to gates of said fourth and fifth field effect transistors, wherein said first gate control signal and second gate control signal are designed and adapted: 1) to turn ON said first, second and sixth field effect transistors while concurrently keeping said third, fourth and fifth field effect transistors biased OFF, and 2) to turn ON said third, fourth and fifth field effect transistors while concurrently keeping said first, second and sixth field effect transistors biased OFF.

4. The high frequency switching circuitry of claim 1, further comprising a third resistor connected in parallel to said second field effect transistor between said output signal terminal and said first node, wherein said third resistor has been sized to have a third resistance which is approximately equal to said first resistance of said first resistor.

5. A high frequency switching circuitry comprising:

at least one input signal terminal into which an input signal is inputted;

an output signal terminal from which an output signal is outputted;

a first resistive switching circuit connected between said input signal terminal and a first node, said first resistive switching circuit having first and second signal transmission channels having first and second resistances, said second resistance of said second channel being much higher than said first resistance of said first channel, said first resistive switching circuit switching said first and second signal transmission channels;

a first switching element, connected between said first node and said output terminal, said first resistive switching circuit and said first switching element being directly connected to each other via said first node, a second switching element directly connected at said first node so that said second switching element is connected in series between said first node and a ground line, wherein said second resistance of said second signal transmission channel of said first resistive switching circuit is approximately equal to a difference of an ON-resistance of said second switching element from an output impedance of a first signal source of said high frequency switching circuitry.

6. The high frequency switching circuitry as claimed in claim 5, wherein said first resistive switching circuit comprises:
   a third switching element connected between said input signal terminal and said first node; and
   a first resistor connected in parallel to said third switching element between said input signal terminal and said first node.

7. The high frequency switching circuitry as claimed in claim 6, wherein said first, second and third switching elements comprise first, second and third field effect transistors; and
   further comprising first and second gate control signal lines on which first and second gate control signals are transmitted, said first gate control signal line being connected to gates of said first and third field effect transistors, said second gate control signal line being connected to a gate of said second field effect transistor.

8. The high frequency switching circuitry of claim 5, further comprising:
   a secondary input signal terminal into which a second input signal is inputted;
   a second resistive switching circuit connected between said secondary input signal terminal and a second node, said second resistive switching circuit having third and fourth signal transmission channels having third and fourth resistances, said fourth resistance of said fourth channel being much higher than said third resistance of said third channel, said second resistive switching circuit switching said third and fourth signal transmission channels;
   a fourth switching element connected between said second node and said output terminal;
   a fifth switching element connected in series between said second node and a ground line,
   wherein said fourth resistance of said fourth signal transmission channel of said second resistive switching circuit is approximately equal to a difference of an ON-resistance of said fourth switching element from an output impedance of a second signal source of said high frequency switching circuitry.

9. The high frequency switching circuitry as claimed in claim 8, wherein said second resistive switching circuit comprises:
   a sixth switching element connected between said second input signal terminal and said second node; and
   a second resistor connected in parallel to said sixth switching element between said input signal terminal and said second node.

10. The high frequency switching circuitry as claimed in claim 9, wherein said fourth, fifth and sixth switching elements comprise fourth, fifth and sixth field effect transistors; and
    further comprising first and second gate control signal lines on which first and second gate control signals are transmitted, said second gate control signal line being connected to gates of said fourth and sixth field effect transistors, said first gate control signal line being connected to a gate of said fifth field effect transistor.

11. A high-frequency switching circuit comprising:
    a first input signal terminal for receiving an input signal;
    an output signal terminal for providing an output signal;
    first and second field effect transistors connected in series between said first input signal terminal and said output signal terminal, said first field effect transistor being coupled to said first input signal terminal, said second field effect transistor being coupled to said output signal terminal, said first and second field effect transistors being directly connected at a first node;
    a third field effect transistor directly connected at said first node so that said third field effect transistor is connected in series between said first node and a ground line to provide a to-ground current path from said first node having a resistance equal to an ON-resistance of said third field effect transistor;
    a first gate control signal line for applying a first gate control signal, said first gate control signal line being connected to both gates of said first and second field effect transistors for transmitting the first gate control signal to said gates of said first and second field effect transistors so that the first gate control signal turning said first and second field effect transistors ON forms a first input-to-output current path from said first input terminal to said output terminal having a resistance equal to an ON-resistance of said first and second field effect transistors;
    a second gate control signal line for applying a second gate control signal, said second gate control signal line being connected to a gate of said third field effect transistor;
    a first resistor connected in a branch, said branch parallel to said first field effect transistor between said first input signal terminal and said first node, wherein said branch has a first branch resistance determined by said first resistor, and said first resistor has a first resistance which is approximately equal to a difference of said ON-resistance of said third field effect transistor from an output impedance of a first signal source applied at said first input signal terminal;
    a second input signal terminal for receiving a second input signal;
    fourth and fifth field effect transistors connected in series between said second input signal terminal and said output signal terminal, said fourth field effect transistor being coupled to said second input signal terminal, said fifth field effect transistor being coupled to said output signal terminal, said fourth and fifth field effect transistors being directly connected to each other via a second node;
    a sixth field effect transistor connected at said second node so that said sixth field effect transistor is connected in series between said second node and a ground line to provide a to-ground current path from said second node having a resistance equal to an ON-resistance of said sixth field effect transistor;
    said first gate control signal being connected to a gate of said sixth field effect transistor, said second gate control signal being connected to gates of said fourth and fifth field effect transistors; and
    a second resistor connected in a second branch, said second branch parallel to said fourth field effect transistor between said second input signal terminal and said second node, wherein said second branch has a second branch resistance determined by said second resistor, and said second resistor has a second resistance which is approximately equal to a difference of said ON-resistance of said sixth field effect transistor from an output impedance of a second signal source applied at said second input signal terminal;

wherein said first gate control signal and second gate control signal are designed and adapted: 1) to turn ON said first, second and sixth field effect transistors while concurrently keeping said third, fourth and fifth field effect transistors biased OFF, and 2) to turn ON said third, fourth and fifth field effect transistors while concurrently keeping said first, second and sixth field effect transistors biased OFF.

* * * * *